United States Patent
Saitou

(10) Patent No.: US 7,231,613 B2
(45) Date of Patent: Jun. 12, 2007

(54) APPARATUS AND SYSTEM FOR DEVELOPING LSI

(75) Inventor: Teruhiko Saitou, Kasugai (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 10/329,447

(22) Filed: Dec. 27, 2002

(65) Prior Publication Data

US 2003/0182636 A1 Sep. 25, 2003

(30) Foreign Application Priority Data

Mar. 20, 2002 (JP) ............................. 2002-079256

(51) Int. Cl.
G06F 17/50 (2006.01)
(52) U.S. Cl. ............................................. 716/1; 716/4
(58) Field of Classification Search ............... 716/1–21; 714/28, 39
See application file for complete search history.

(56) References Cited

U.S. PATENT DOCUMENTS

| | | | |
|---|---|---|---|
| 6,530,065 B1 * | 3/2003 | McDonald et al. ............ 716/4 |
| 6,578,174 B2 * | 6/2003 | Zizzo ............................. 716/1 |
| 6,594,799 B1 * | 7/2003 | Robertson et al. ............. 716/1 |
| 6,634,008 B1 * | 10/2003 | Dole ............................. 716/1 |
| 6,668,360 B1 * | 12/2003 | Liu ............................... 716/4 |
| 6,983,438 B1 * | 1/2006 | Newman et al. ............... 716/8 |
| 2001/0042226 A1 * | 11/2001 | Dzoba et al. ................. 714/39 |
| 2001/0044667 A1 * | 11/2001 | Nakano et al. ............. 700/100 |
| 2002/0059542 A1 * | 5/2002 | Debling ....................... 714/28 |
| 2002/0156929 A1 * | 10/2002 | Hekmatpour ............... 709/310 |
| 2002/0188910 A1 * | 12/2002 | Zizzo ............................. 716/1 |
| 2003/0055520 A1 * | 3/2003 | Tomii .......................... 700/97 |

* cited by examiner

Primary Examiner—Jack Chiang
Assistant Examiner—Magid Y. Dimyan
(74) Attorney, Agent, or Firm—Staas & Halsey LLP

(57) ABSTRACT

A system for efficiently developing an LSI. A developing system includes a developing apparatus and a support center, which are connected to each other via the Internet. The host computer of the developing apparatus designs the software of a system LSI in accordance with a user's instruction. An emulator debugger sends design data to the support center. The support center performs a predetermined process on the received design data and notifies the processing result to a host computer via the Internet.

20 Claims, 6 Drawing Sheets

APPARATUS AND SYSTEM FOR DEVELOPING LSI

CROSS-REFERENCED TO RELATED APPLICATION

This application is based upon and claims the benefit of priority from the prior Japanese Patent Application No. 2002-79256, filed on Mar. 20, 2002, the entire contents of which are incorporated herein by reference.

BACKGROUND OF THE INVENTION

The present invention relates to an apparatus and system for developing LSIs.

In recent years, a system semiconductor integrated circuit (LSI) that achieves the function of a system level on a single chip has been developed. When developing a system LSI, various types of data are transferred between a user who develops and designs the system LSI, and a maker who manufactures the system LSI based on the user's design data (e.g., ROM data of a microcomputer). To improve the developing efficiency, it is desired that the data be quickly transferred between the user and the maker.

The design data generated by the user (designer) includes ROM data (firmware), which is stored in a non-volatile memory, such as a mask ROM or a flash memory, that is connected to a system LSI, and circuit data, such as that of a programmable logic array (PLA). The design data is stored in a medium such as a flexible disk organ EPROM. The designer either sends the medium to the system LSI maker by mail or by e-mail. The LSI maker manufactures the system LSI based on the design data recorded on the received medium and sends the system LSI to the user.

FIG. 1 is a flowchart illustrating the flow for processing a prior art LSI.

A developing apparatus 91 performs steps S101, S102, and S108. In step S101, the developing apparatus 91 performs the setting of the environment, such as setting tools (e.g., a compiler or a debugger) prior to the developing of a system LSI. In step S102, the developing apparatus 91 designs and develops an LSI in the set environment. In step S103, the design data of the LSI is sent to the LSI maker by mail or e-mail.

In step S104, a support center 92 of the LSI maker receives the design data. In step S105, the support center 92 generates data for manufacturing the LSI from the design data. In step S106, the LSI is manufactured in accordance with the manufacturing data in a manufacturing plant. The manufacturing plant sends a sample of the LSI to the user.

In step S107, the user conducts function tests on the LSI sample with a tester (not shown). If the results of the function tests indicate a problem (NG), the design data is corrected in step S108. If there are no problems with the results of the function tests (OK), the developing is completed.

To record the ROM data of the system LSI that is designed by the user on a medium, such as an EPROM, address conversion must be performed.

FIG. 2 shows an example of the address conversion.

It is assumed here that the memory of the system LSI that is being developed includes the address spaces of 00000000h to 00xxFFFFh. Among these address spaces, ROM data is stored in the areas of 00080000h to 0008FFFFh. When recording the ROM data in an EPROM, the memory addresses (00080000h to 0008FFFFh) of the ROM data must be converted to an EPROM addresses (00000000h to 0000FFFFh). This is because the address of the system LSI used by a CPU to read the ROM data differs from the address of the ROM data stored in the EPROM.

Such address conversion must be performed in accordance with the memory map and specification of the system LSI that is being developed and in accordance with a format used by the LSI maker to receive the ROM data. Thus, the conversion is burdensome and increases the possibility of errors occurring when converting addresses. It is also burdensome for the LSI maker to check the received data and perform address conversion on the received data. This makes it difficult to shorten the delivery of the system LSI.

Further, the transmission of the ROM data by e-mail may result in security problems, such as leakage or loss of the ROM data when the wrong data is attached to an e-mail and erroneously transmitted.

In the prior art developing environment, it is difficult for the LSI maker to acknowledge the specific details of the system LSI (i.e., the used resources and commands). Thus, it is difficult for the LSI maker to provide thorough customer support.

SUMMARY OF THE INVENTION

It is an object of the present invention to provide an apparatus and system for efficiently developing an LSI.

To achieve the above object, the present invention provides an apparatus for developing a semiconductor integrated circuit. The developing apparatus includes a computer executing a program for developing the semiconductor integrated circuit. The program causes the computer to generate design data of the semiconductor integrated circuit, access a support center via a network, and send the design data to the support center.

A further perspective of the present invention is a system for developing a semiconductor integrated circuit. The developing system includes a developing apparatus, which is connected to a support center via a network. The developing apparatus develops the semiconductor integrated circuit and includes a computer for generating design data of the semiconductor integrated circuit. The computer executes a predetermined program for enabling data communication with the support center. The predetermined program causes the computer to send the design data to the support center, and receive a processing result of the design data processed by the support center.

A further perspective of the present invention is a method for developing a semiconductor integrated circuit including generating design data of the semiconductor integrated circuit using a first computer, sending the design data to a second computer from the first computer via a network, checking the design data with the second computer, generating manufacturing data from the design data with the second computer in accordance with the checking result, and sending a copy of the manufacturing data to the first computer from the second computer via the network.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

A developing system 11 according to a preferred embodiment of the present invention will now be discussed.

Figure 1:
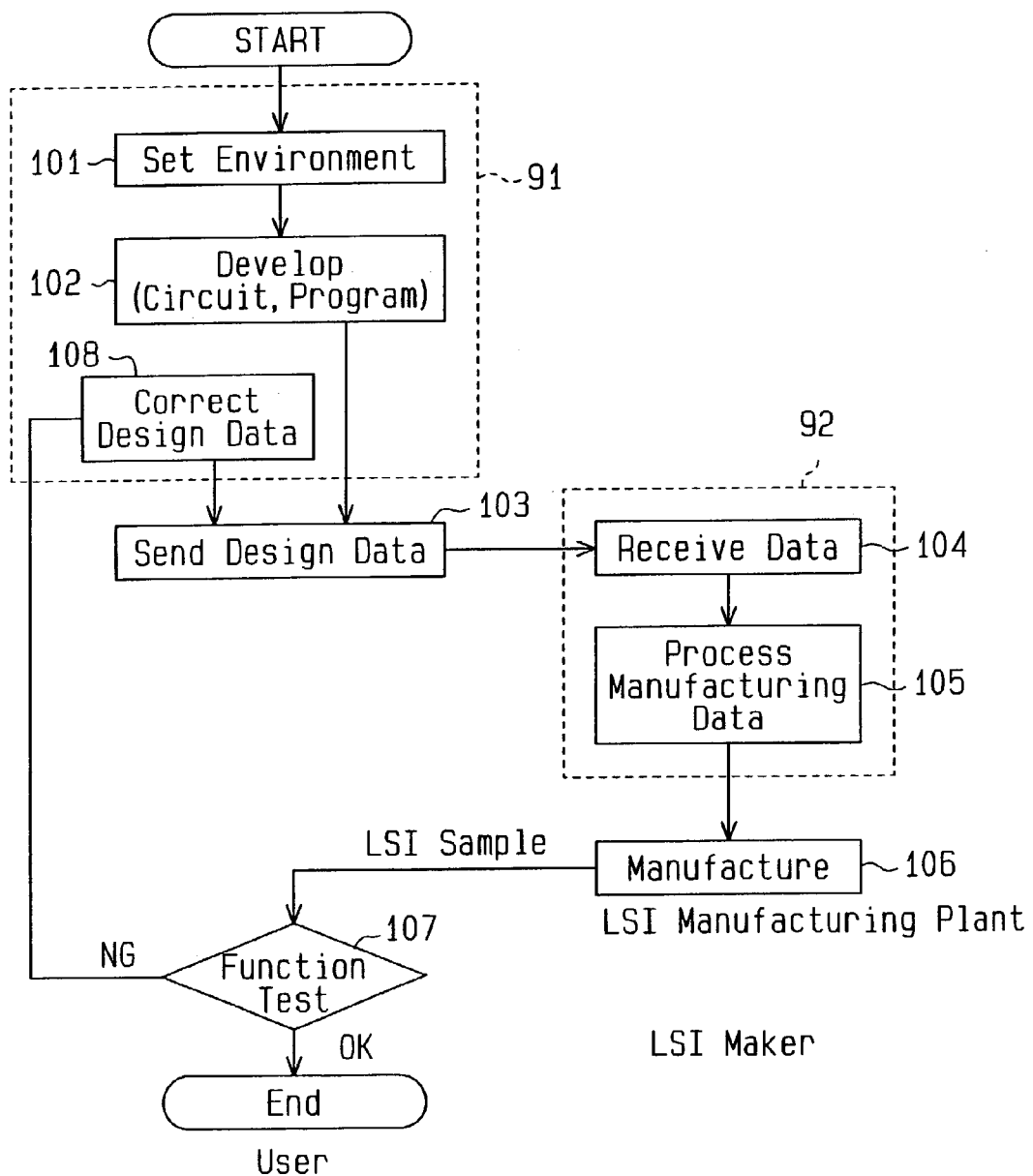
FIG. 1 is a flowchart illustrating a prior art LSI developing process.
Figure 2:
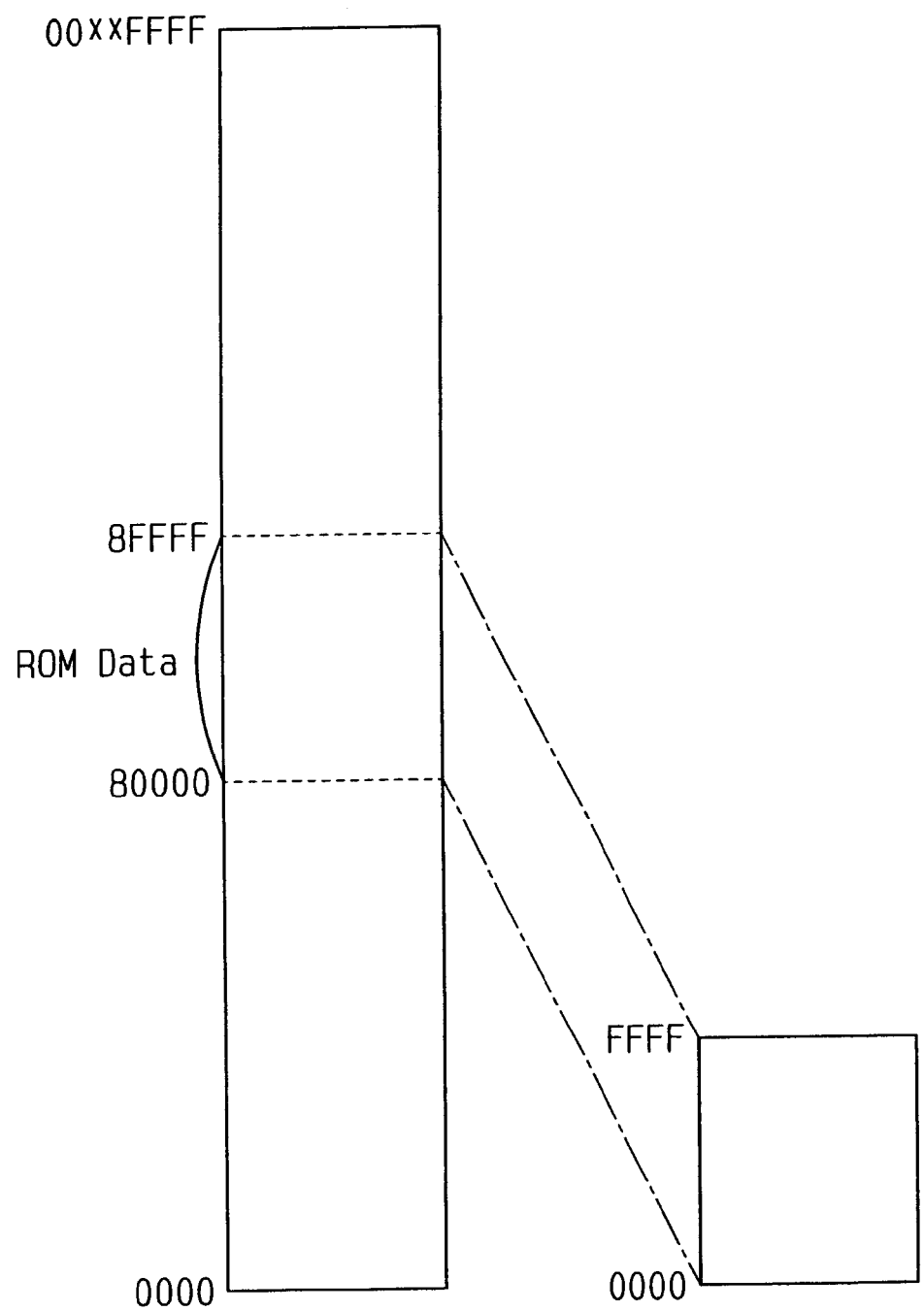
FIG. 2 illustrates address conversion for a system LSI and an EPROM.
Figure 3:
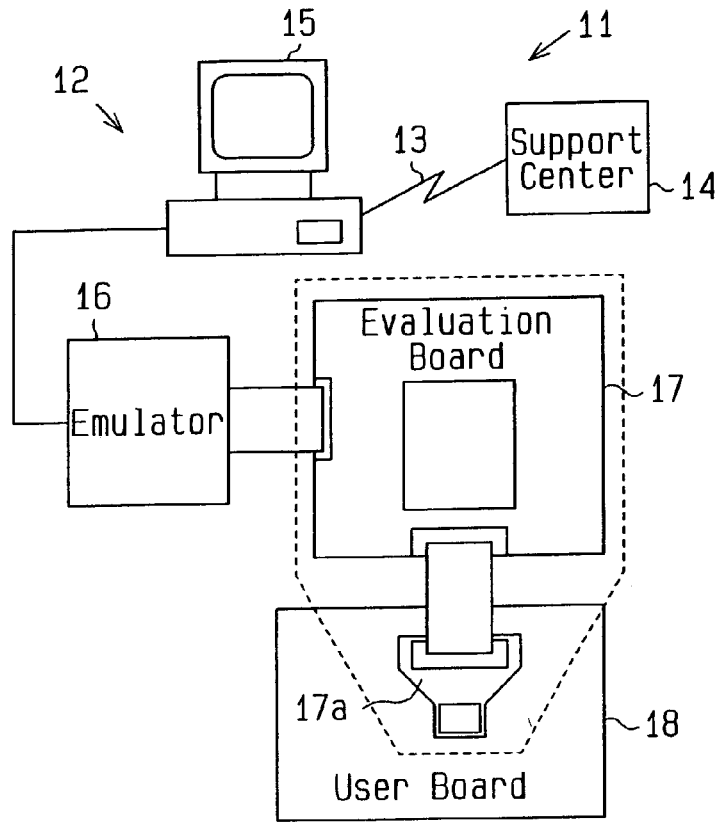
FIG. 3 is a schematic diagram showing a developing system according to a preferred embodiment of the present invention.

With reference to FIG. 3, the developing system 11 includes a developing apparatus 12, which is operated by a developer (user) to develop a system LSI, and a support center 14, which is connected to the developing apparatus 12 by a network such as the Internet 13. The support center 14 is, for example, an LSI maker, which manufactures system LSIs.

The developing apparatus 12 includes a host computer 15, such as a personal computer, an emulator 16 connected to the host computer 15, an evaluation board 17 connected to the emulator 16, and a user board 18 connected to the evaluation board 17 by a connector 17a, which is referred to as a pod. The host computer 15 is connected to a computer 14a (refer to FIG. 5), which is installed in the support center 14, through the Internet 13.

In FIG. 3, the developing apparatus 12 (i.e., the host computer 15, the emulator 16, the evaluation board 17, and the user board 18) is illustrated in a functionally divided manner. The developing apparatus 12 may be formed in an integral manner by, for example, incorporating the evaluation board 17 in the emulator 16.

The user board 18 is a board of a device in which the user actually uses the developing subject system LSI.

The evaluation board 17 is provided with the functions of the developing subject system LSI. That is, the evaluation board 17 incorporates functional circuits, which are used in the developing subject system LSI, and an interface circuit (not shown), which supports the debugging of programs.

Figure 5:
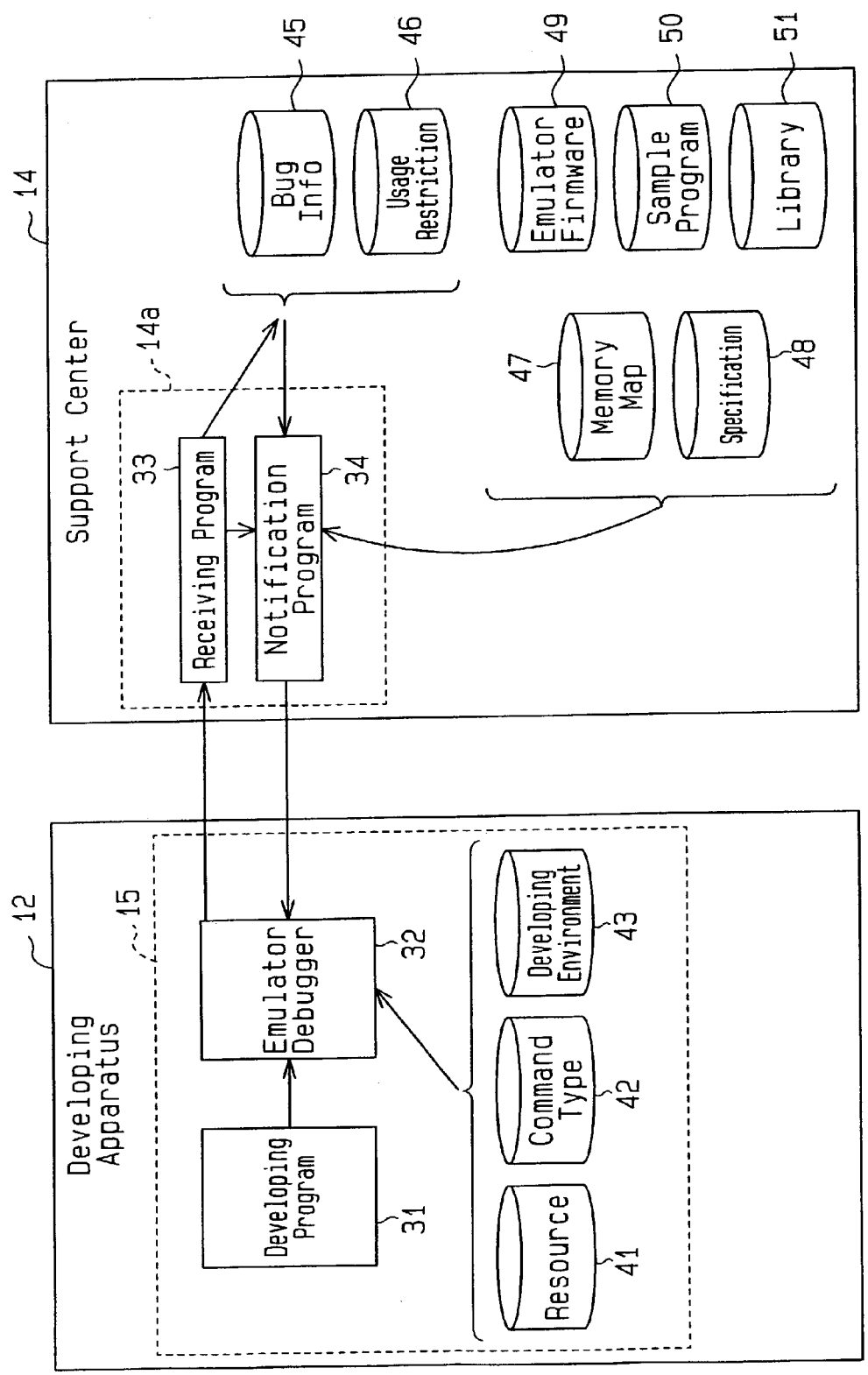

The host computer 15 stores application programs, which are used to develop software of system LSIs, and a control program of the emulator 16. The application programs include a developing program 31, such as a compiler that generates an execution program of a system LSI from a high grade program language, and an emulator debugger 32, which supports the debugging of the execution program by operating the emulator 16 (FIG. 5).

The emulator debugger 32 has a communication function for performing data communication with other computers, which are network-connected to the host computer 15. The communication destination of the host computer 15 is set to the support center 14. The connection route of the communication is set when the emulator debugger 32 is installed. Due to the communication function of the emulator debugger 32, the communication of compressed and encoded data is performed between the developing apparatus 12 and the support center 14.

The user operates the host computer 15 to activate the emulator debugger 32, control the operation of the system LSI on the evaluation board 17 through the emulator 16, and monitor internal signals. The user performs debugging while checking the operations of the emulator debugger 32 to develop the system LSI. The developed system LSI is sent from the host computer 15 to the support center (LSI maker) via the Internet 13.

Figure 4:
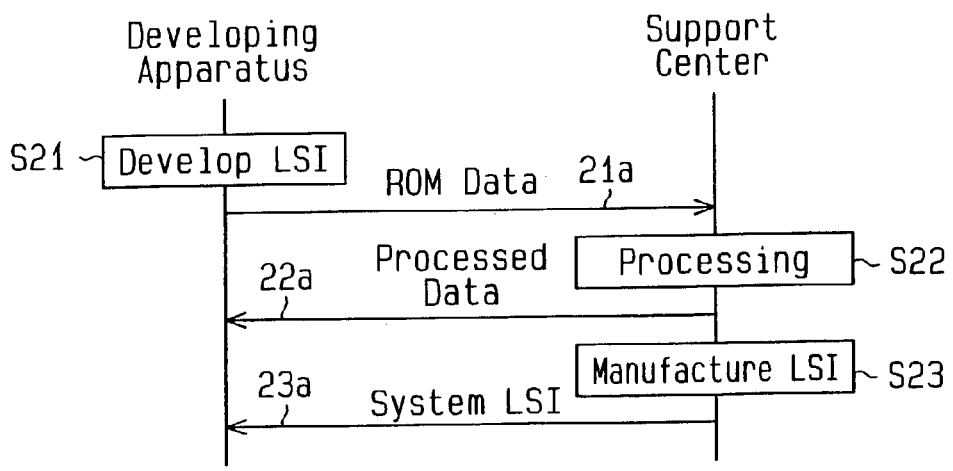
FIGS. 4 and 5 illustrate the flow of processing in the developing system of FIG. 3.

FIG. 4 illustrates the processing performed by the developing system 11.

In step S21, the developing apparatus 12 generates the ROM data of the developing subject system LSI in accordance with the user's instructions. The ROM data is program data, which is written to a non-volatile memory, such as a mask ROM or a flash memory. The non-volatile memory is connected to the system LSI.

In step S21a, the communication functions of the emulator debugger 32 in the host computer sends the ROM data to the computer 14a in the support center (LSI maker) 14.

In step S22, the support center 14 receives the ROM data and performs a predetermined process on the ROM data. In step S22a, the processed ROM data (processed data) is sent to the developing apparatus 12 from the support center 14. The predetermined process of step S22 is, for example, format conversion of ROM data.

In step S23, the system LSI is manufactured in accordance with the processed data. In step S23a, the system LSI is sent to the user.

The processing performed by the developing system 11 will now be discussed in more detail with reference to FIG. 5.

The host computer 15 of the developing apparatus 12 has the developing program 31, which is used to develop the software of the system LSI, and the emulator debugger 32, which is provided with a data communication function for accessing the computer 14a in the support center 14 via the Internet 13. The emultor debugger 32 is a program provided with a function for performing communication with the computer 14a of the support center 14. The host computer 15 generates design data (ROM data) in accordance with the developing program 31. The design data is transmitted on-line to the support center 14 using the communication function of the emulator debugger 32.

The host computer 15 includes a data base group for storing information for setting the developing subject system LSI. The data base group includes a resource database 41, a command type database 42, and a developing environment database 43. The resource database 41 stores the resources actually used by the user in the developing subject system LSI. The command type database 42 stores the types of commands executed by the programs developed by the user. The developing environment database 43 stores tools used to develop system LSIs, such as a compiler and a debugger. The communication functions of the emulator debugger 32 enable the setting information stored in the resource database 41, the command type database 42, and the developing environment database 43 to be sent to the support center 14 together with the design data of the system LSI.

The computer 14a in the support center 14 has a receiving program 33, which responds to access by the developing apparatus 12 (host computer 15), and a notification program 34, which notifies the developing apparatus 12 of the processing result corresponding to a request of the developing apparatus 12.

The receiving program 33 enables the computer 14a in the support center 14 to receive the design data and the setting information of the system LSI in response to an access from the host computer 15. The computer 14a performs a predetermined process, such as format conversion, on the design data. The processing result is sent to the host computer 15 by the notification program 34. The computer 14a of the support center 14 checks whether a bug is included in the design data. The computer 14a notifies the host computer 15 of the debug information, which includes bug information 45 and usage restriction information 46 of the design data. The host computer 15 quickly acknowledges deficiencies of a design data program based on the debug information. This enables the developing of a system LSI under a new environment.

The computer 14a in the support center 14 has a database for storing various types of setting information (e.g., a memory map 47, a specification 48, an emulator firmware 49, a sample program 50, and a library 51) to develop a system LSI (develop software).

The developing apparatus 12 develops software by using the emulator firmware 49 (e.g., firmware of the developing program 31), the sample program 50, and the library 51. The developing apparatus 12 receives the memory map 47 and the specification 48 of the developing subject system LSI from the support center 14 and optimizes the setting for the emulator debugging. Thus, the developing of the system LSI is performed based on the new setting.

Figure 6:
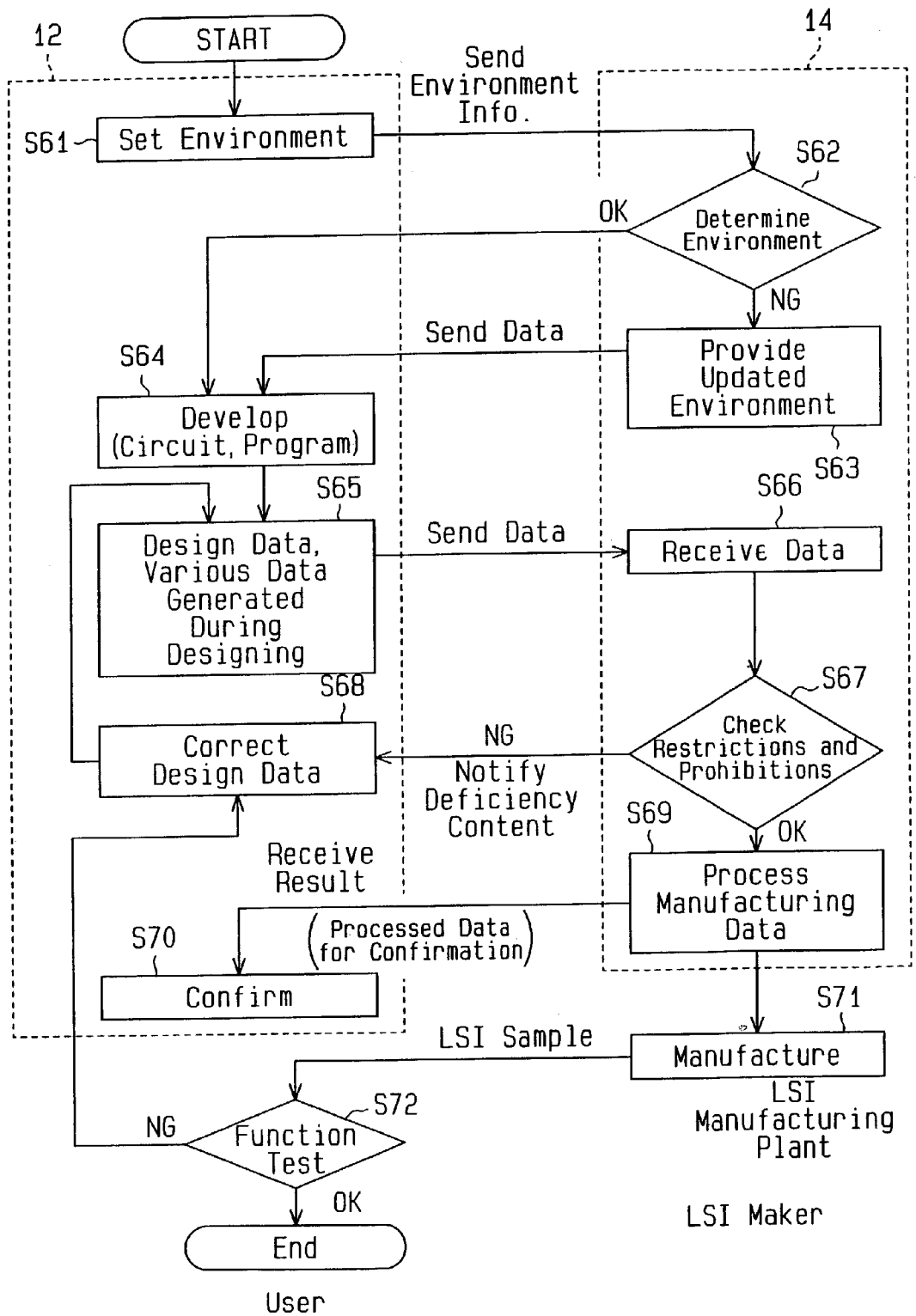
FIG. 6 is a flowchart illustrating the developing performed by the developing system of FIG. 3.

The LSI developing process will now be discussed in detail with reference to FIG. 6.

In step S61, the developing apparatus 12 performs the setting of the environment for developing a system LSI including the setting of developing tools (compiler and debugger). The set developing environment information is sent to the support center 14 via the Internet 13 by the communication function of the emulator debugger 32.

In step S62, the computer 14a of the support center 14 receives the developing environment information and determines whether or not the setting of the developing environment information is optimal. If there is a problem in the setting of the developing environment information, in step S63, the support center 14 provides the developing apparatus 12 with updated developing environment information. The updated developing environment information includes firmware programs, a library, and type setting information. In step S64, the developing apparatus 12 develops the LSI with the updated developing environment information that it received. If there is no problem in the developing environment setting (i.e., OK in step S62), the developing apparatus 12 informs the support center 14 that there is no problem. Then, in step S64, the developing apparatus 12 develops the LSI in the set developing environment.

In step S65, after developing an LSI, the developing apparatus 12 sends the design data of the LSI and annex data to the support center 14. The annex data includes, for example, the operation mode of the LSI, a code list of the used commands, an execution memory area used when a program is activated, a resource (function list) of the used LSI, and information of the actual operation speed.

In step S66, the support center 14 receives design data from the developing apparatus 12. In step S67, the support center 14 checks the restrictions and prohibitions of the design data. The support center 14 may also check whether or not the program has bugs.

When the design data includes a deficiency (NG in step S67), the support center 14 notifies the developing apparatus 12 of the deficiency. The developing apparatus 12, which receives the notification, corrects the design data in step S68 and sends the corrected design data to the support center 14 again. If the design data does not have a deficiency (OK in step S67), the support center 14 processes the design data in step S69 and generates data for manufacturing the LSI. The support center 14 sends the LSI manufacturing data to an LSI manufacturing plant.

The support center 14 sends a copy of the LSI manufacturing data to the developing apparatus 12. After manufacturing the LSI, the developing apparatus confirms the specification of the LSI based on the copy (processed data for confirmation) in step S70.

At step S71, the LSI manufacturing plant manufactures a sample of the LSI in accordance with the manufacturing data and sends the sample to the user. At step S72, the user tests the functions of the LSI sample with a tester (not shown). When there is a problem such as abnormal functioning (NG in step S72), the developing apparatus 12 corrects the design data. In this case, the user and the LSI maker repeats steps S68 to S72. If the results of the function test do not have any problems (OK in step S72), developing is completed.

Figure 7:
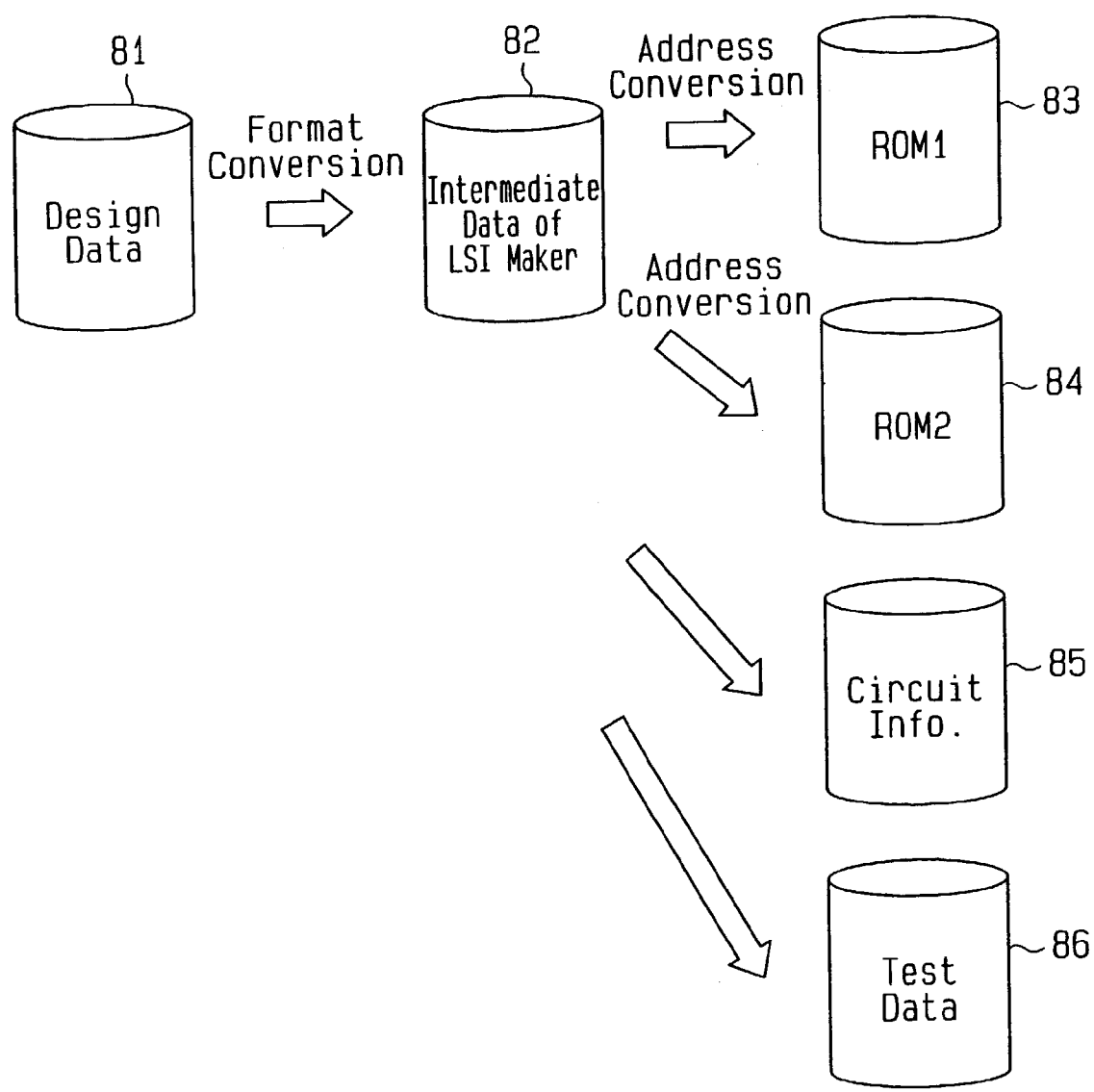
FIG. 7 illustrates a design data conversion process.

Data processing performed at the support center 14 will now be discussed with reference to FIG. 7.

The support center 14 receives design data 81 of the LSI from the developing apparatus 12. The design data 81 is recorded in a data format corresponding to the developing apparatus 12 (developing maker). Thus, the support center 14 first converts the data format of the design data to the LSI maker's data format and generates intermediate data 82.

The support center 14 performs address conversion on the intermediate data 82 to generate ROM data 83, 84. Further, the support center 14 generates circuit information data 85 and test data 86, which indicates whether the pull-up/down resistance is set, from the intermediate data 82. The support center 14 sends the data 83–86 to the developing apparatus 12 and the LSI manufacturing plant. In other words, the data 83–86 correspond to the manufacturing data.

The preferred embodiment has the advantages described below.

(1) The developing system 11 includes the developing apparatus 12 and the support center 14, which are connected by the Internet 13. The host computer 15 of the developing apparatus 12 develops software of the system LSI in accordance with the user's instructions. The design data of the software is sent to the support center 14 on-line using the communication function of the emulator debugger 32. The support center 14 performs various types of processes on the design data and notifies the host computer 15 of the processing result. In this manner, data communication is performed in real time between the developing apparatus 12 and the support center 14. This improves the developing efficiency of the system LSI.

(2) The communication function of the emulator debugger 32 transmits data to the support center 14 from the developing apparatus 12. Thus, a person is not involved with the data transmission. This prevents human errors, such as the attachment of a wrong file to an e-mail and the transmission of data to a wrong destination.

(3) After transmitting design data to the support center 14, the designing apparatus 12 receives the results of the processing performed on the design data at the support center 14. Accordingly, the problems that occur when developing an LSI is quickly fed back to the developing apparatus 12 and the user.

(4) Compressed and encoded data is communicated between the developing apparatus 12 and the support center 14. This guarantees the security and reliability of the data that is being communicated.

(5) In addition to the design data of a system LSI, system LSI setting information, such as the resource database 41, the command type database 42, and the developing environment database 43, may be sent from the developing apparatus 12 to the support center 14. This enables the support center 14 to acknowledge the state of the system LSI used by the user. Thus, the user is provided with improved support.

(6) The support center 14 provides the developing apparatus 12 with debug information, such as the bug information 45 and the usage restriction information 46. Accordingly, the developing apparatus 12 performs LSI developing under an updated environment based on the debug information. This improves the reliability of the system LSI.

(7) The developing apparatus 12 retrieves the emulator firmware 49, which is used to develop software, and setting information, such as the sample program 50, from the support center 14 and develops the system LSI based on the retrieved information. This further improves the developing efficiency.

(8) The developing apparatus 12 retrieves the memory map 47 and specification 48 of the system LSI from the support center 14 and develops the system LSI using the emulator debugger 32, which is set in accordance with the memory map 47 and the specification 48. This prevents the system LSI from being generated in the wrong developing environment.

(9) The developing apparatus 12 sends non-processed design data (data on which address conversion has not been performed) to the support center 14. This reduces the number of operations performed by the developing apparatus and lowers cost.

It should be apparent to those skilled in the art that the present invention may be embodied in many other specific forms without departing from the spirit or scope of the invention. Particularly, it should be understood that the present invention may be embodied in the following forms.

A system LSI may be developed by an apparatus other than the developing apparatus 12.

The emulator 16 may be provided with a communication function for accessing the support center 14, and the emulator 16 may be connected to the support center 14.

The emulator debugger 32 may be set so that the bug information 45 and the usage restriction information 46 are periodically sent to the developing apparatus 12.

The support center 14 may have LSI developing setting information other than the memory map 47, the specification 48, the emulator firmware 49, the sample program 50, and the library 51.

The communication function of the emulator debugger 32 may be achieved by a module, which is accessible by the emulator debugger 32 and installed in another network connected device (e.g., host computer 15).

The support center 14 does not necessarily have to be located in the system LSI maker.

The emulator debugger 32 may be replaced by a debugger, which does not perform emulation. In this case, the developing subject CPU and the CPU of the developing environment have the same architecture.

The present examples and embodiments are to be considered as illustrative and not restrictive, and the invention is not to be limited to the details given herein, but may be modified within the scope and equivalence of the appended claims.

What is claimed is:

1. A semiconductor integrated circuit (LSI) developing apparatus for developing a semiconductor integrated circuit, the developing apparatus comprising:
   a host computer storing and executing a locally stored program that develops the semiconductor integrated circuit and performs data communication exclusively with a support center of an LSI maker via a network; and
   an evaluation board incorporating a circuit corresponding to functions of the developing subject semiconductor integrated circuit, wherein the locally stored program, when executed by the host computer, causes the host computer to:
   send developing environment information of the host computer only to the support center of the LSI maker;
   receive a feedback with respect to the developing environment information of the host computer from the support center;
   generate design data of the semiconductor integrated circuit upon receipt of the feedback; and
   send the design data only to the support center of the LSI maker via the network.

2. The developing apparatus according to claim 1, wherein the support center processes the design data, the executing program causing the host computer to receive a processing result of the design data from the support center.

3. The developing apparatus according to claim 1, wherein the support center generates debug information of the design data, the executing program causing the host computer to receive the debug information from the support center.

4. The developing apparatus according to claim 3, wherein the debug information includes bug information and usage restriction information of the executing program relative to the debug information.

5. The developing apparatus according to claim 1, wherein the support center has setting information for developing the semiconductor integrated circuit, the executing program causing the host computer to receive the setting information from the support center.

6. The developing apparatus according to claim 5, wherein the setting information is information of at least one of a sample program of the semiconductor integrated circuit, a library, firmware of the developing program, or memory map and specification of the semiconductor integrated circuit.

7. The developing apparatus according to claim 1, wherein the executing program causes the host computer to send the setting information of the semiconductor integrated circuit to the support center.

8. The developing apparatus according to claim 7, wherein the setting information of the semiconductor integrated circuit is information of at least one of resource, command type of program, or developing environment of the semiconductor integrated circuit.

9. The developing apparatus according to claim 1, wherein the developing apparatus compresses and encodes the design data and sends the compressed and encoded design data to the support center.

10. The developing apparatus according to claim 1, wherein the executing program includes an emulator debugger for supporting debugging of a program that activates the semiconductor integrated circuit.

11. The developing apparatus according to claim 1, further comprising:
   an emulator debugger monitoring operations of said circuit of the evaluation board.

12. A semiconductor integrated circuit (LSI) developing system for developing a semiconductor integrated circuit, the developing system comprising:

a developing apparatus connected to a support center of an LSI maker via a network, wherein the developing apparatus develops the semiconductor integrated circuit and includes a host computer, which stores and executes a locally stored program that develops and locally generates design data of the semiconductor integrated circuit and performs data communication exclusively with the support center of the LSI maker via the network, and an evaluation board incorporating a circuit corresponding to functions of the developing subject semiconductor integrated circuit, wherein the predetermined, locally stored program, when executed by the host computer, causes the host computer to:

send developing environment information of the host computer only to the support center of the LSI maker;

receive a feedback with respect to the developing environment information of the host computer from the support center;

send the design data only to the support center of the LSI maker upon receipt of the feedback; and receive a processing result of the design data processed by the support center of the LSI maker.

13. The developing system according to claim 12, wherein the developing apparatus further includes an emulator debugger monitoring operations of said circuit of the evaluation board.

14. A method for developing a semiconductor integrated circuit using a developing apparatus including a first computer storing and executing a locally stored program that develops the semiconductor integrated circuit and performs data communication exclusively with a second computer of an LSI maker via a network when executed by the first computer and an evaluation board incorporating a circuit corresponding to functions of the developing semiconductor integrated circuit, the method comprising:

sending developing environment information of the fist computer only to the second computer of the LSI maker via the network;

receiving a feedback with respect to the developing environment informatio of the fist computer from the second computer of the LSI maker via the network;

executing the locally stored program with the first computer to locally generated design data of the semiconductor integrated icrcuit upon receipt of the feedback, and to send the design data only to the second computer of the LSI maker from the first computer via the network;

checking the design data with the second computer of the LSI maker;

generating manufacturing data from the design data with the second computer of the LSI maker using the results of the design data checking; and sending a copy of the manufacturing data to the first computer from the second computer of the LSI maker via the network.

15. The method according to claim 14, further comprising:

manufacturing a sample of the semiconductor integrated circuit in accordance with the manufacturing data; and testing the functions of the semiconductor integrated circuit sample.

16. The method according to claim 14, further comprising:

setting an environment for developing the semiconductor integrated circuit with the first computer prior to the step for sending the design data;

sending information of the environment from the first computer to the second computer via the network prior to the step for sending the design data; and checking from the information of the environment whether the setting of the environment is optimal for developing the semiconductor integrated circuit with the second computer, and notifying the first computer of the result prior to the step for sending the design data.

17. The method according to claim 14, further comprising compressing and encoding the design data with the first computer prior to the step for sending the design data.

18. The method according to claim 14, further comprising compressing and encoding the copy of the manufacturing data with the second computer prior to the step for sending the copy.

19. The method according to claim 14, further comprising confirming the specification of the semiconductor integrated circuit with the copy of the manufacturing data.

20. The method according to claim 14, wherein the developing apparatus further includes an emulator debugger monitoring operations of said circuit of the evaluation board.

* * * * *

UNITED STATES PATENT AND TRADEMARK OFFICE
CERTIFICATE OF CORRECTION

| | |
|---|---|
| PATENT NO. | : 7,231,613 B2 |
| APPLICATION NO. | : 10/329447 |
| DATED | : June 12, 2007 |
| INVENTOR(S) | : Teruhiko Saitou |

It is certified that error appears in the above-identified patent and that said Letters Patent is hereby corrected as shown below:

Column 9, Line 37, change "fist" to --first--.

Column 9, Line 41, change "informatio" to --information--.

Column 9, Line 41, change "fist" to --first--.

Column 9, Line 44, change "generated" to --generate--.

Column 9, Line 45, change "icrcuit" to --circuit--.

Signed and Sealed this

Fifteenth Day of January, 2008

JON W. DUDAS
*Director of the United States Patent and Trademark Office*